US008044379B2

(12) United States Patent
Wu

(10) Patent No.: US 8,044,379 B2
(45) Date of Patent: Oct. 25, 2011

(54) WELL-ALIGNED, HIGH ASPECT-RATIO, HIGH-DENSITY SILICON NANOWIRES AND METHODS OF MAKING THE SAME

(75) Inventor: Yongxian Wu, Wayne, NJ (US)

(73) Assignees: Hitachi Chemical Co., Ltd., Tokyo (JP); Hitachi Chemical Research Center, Inc., Irvine, CA (US)

( * ) Notice: Subject to any disclaimer, the term of this patent is extended or adjusted under 35 U.S.C. 154(b) by 0 days.

(21) Appl. No.: 12/311,567

(22) PCT Filed: Oct. 5, 2007

(86) PCT No.: PCT/US2007/021348
§ 371 (c)(1),
(2), (4) Date: Dec. 4, 2009

(87) PCT Pub. No.: WO2008/045301
PCT Pub. Date: Apr. 17, 2008

(65) Prior Publication Data
US 2010/0065819 A1   Mar. 18, 2010

Related U.S. Application Data

(60) Provisional application No. 60/849,437, filed on Oct. 5, 2006.

(51) Int. Cl.
*H01L 21/20* (2006.01)
*H01L 21/00* (2006.01)

(52) U.S. Cl. ............ 257/9; 257/3; 257/12; 257/21; 257/22; 257/28; 257/E29.082; 257/E29.09; 257/E29.168; 257/E29.322; 257/E51.04; 438/22; 438/478; 438/753; 438/930; 438/962; 977/762; 977/768; 977/789

(58) Field of Classification Search .......... 257/3, 9, 257/12, 21, 22, 28, E29.082, E29.09, E29.168, 257/E29.322, E51.04; 438/22, 478, 753, 438/930, 962; 977/762, 768, 789
See application file for complete search history.

(56) References Cited

U.S. PATENT DOCUMENTS

| | | |
|---|---|---|
| 5,077,143 A | 12/1991 | Barraclough et al. |
| 5,348,618 A | 9/1994 | Canham et al. |
| 5,358,600 A | 10/1994 | Canham et al. |
| 5,458,735 A | 10/1995 | Richter et al. |
| 5,552,328 A | 9/1996 | Orlowski et al. |

(Continued)

FOREIGN PATENT DOCUMENTS

CN    1805160 A    7/2006

(Continued)

OTHER PUBLICATIONS

English translation of Second Office Action issued Apr. 6, 2011 in corresponding Japanese Application No. 2007-800373753.

(Continued)

*Primary Examiner* — Dao Nguyen
(74) *Attorney, Agent, or Firm* — Buchanan Ingersoll & Rooney PC

(57) ABSTRACT

A method of producing silicon nanowires includes providing a substrate in the form of a doped material; formulating an etching solution; and applying an appropriate current density for an appropriate length of time. Related structures and devices composed at least in part from silicon nanowires are also described.

45 Claims, 10 Drawing Sheets

U.S. PATENT DOCUMENTS

| | | | |
|---|---|---|---|
| 5,561,304 | A | 10/1996 | Canham et al. |
| 5,612,255 | A | 3/1997 | Chapple-Sokol et al. |
| 5,627,382 | A | 5/1997 | Canham et al. |
| 5,767,020 | A | 6/1998 | Sakaguchi et al. |
| 5,914,183 | A | 6/1999 | Canham |
| 5,920,078 | A | 7/1999 | Frey |
| 5,976,957 | A * | 11/1999 | Westwater et al. ........... 438/478 |
| 6,147,359 | A | 11/2000 | Canham et al. |
| 6,171,512 | B1 | 1/2001 | Sakaguchi et al. |
| 6,238,586 | B1 | 5/2001 | Sakaguchi et al. |
| 6,254,794 | B1 | 7/2001 | Sakaguchi et al. |
| 6,313,015 | B1 | 11/2001 | Lee et al. |
| 6,322,895 | B1 | 11/2001 | Canham |
| 6,369,405 | B1 | 4/2002 | Canham et al. |
| 6,380,550 | B1 | 4/2002 | Canham et al. |
| 6,864,190 | B2 | 3/2005 | Han et al. |
| 7,426,025 | B2 * | 9/2008 | Wang ........................... 356/301 |
| 2002/0088969 | A1 | 7/2002 | Lee et al. |
| 2002/0172820 | A1 | 11/2002 | Majumdar et al. |
| 2003/0135971 | A1 | 7/2003 | Liberman et al. |
| 2004/0106218 | A1* | 6/2004 | Wang et al. ..................... 438/15 |
| 2004/0118698 | A1 | 6/2004 | Lu et al. |
| 2005/0164432 | A1* | 7/2005 | Lieber et al. .................. 438/149 |
| 2005/0253138 | A1 | 11/2005 | Choi et al. |
| 2006/0019472 | A1 | 1/2006 | Pan et al. |
| 2006/0154128 | A1 | 7/2006 | Kim et al. |
| 2006/0188774 | A1 | 8/2006 | Niu et al. |

FOREIGN PATENT DOCUMENTS

| | | |
|---|---|---|
| CN | 101107737 A | 1/2008 |
| WO | WO 91/09420 | 6/1991 |
| WO | WO 03/077298 A1 | 8/2003 |

OTHER PUBLICATIONS

Ball, "Let There be Light" Nature, 2001, vol. 409, pp. 974-976.

Canham, "Silicon Quantum Wire Array Fabrication by Electrochemical and Chemical Dissolution of Wafers" Appl. Phys. Lett., 1990, vol. 57, No. 10, pp. 1046-1048.

Canham et al., "Progress Towards Silicon Optoelectronics Using Porous Silicon Technology" Applied Surface Science, 1996, vol. 102, pp. 436-441.

Canham, "Properties of Porous Silicon" L.T. (Ed.), Chapter 12. Application Areas, INSPEC, London, UK, (1997), pp. 341-399.

Cullis et al., "Visible Light Emission due to Quantum Size Effects in Highly Porous Crystalline Silicon" Letters to Nature, 1991, vol. 353, pp. 335-338.

Edit, "Investigation of Pristine and Oxidized Porous Silicon" Oulu University Press, Oulu 2005, pp. 1-59.

Fan et al., "Nanocarpet Effect: Pattern Formation During the Wetting of Vertically Aligned Nanorod Arrays" Nano Letters, 2004, vol. 4, No. 11, pp. 2133-2138.

Fan et al., "Fabrication of Silica Nanotube Arrays form Vertical Silicon Nanowire Templates" J. American Chemical Society, 2003, vol. 125, pp. 5254-5255.

Haq et al., "Nanopatterned Topography for Supporting Neurite Growth" Department of Biological and Agricultural Engineering, 1 page.

He et al., "Dispersion, Refinement, and Manipulation of Single Silicon Nanowires" Applied Physics Letters, 2002, vol. 80, No. 10, pp. 1812-1814.

Holmes et al., "Control of Thickness and Orientation of Solution-Grown Silicon Nanowires" Science, 2000, vol. 287, pp. 1471-1473.

Lehmann, V., Chapter 10. Applications, in "Electrochemistry of Silicon":Instrumentation, Science, Materials and Applications, Wiley-VCH, (2002), pp. 207-241.

Marsen et al., "Fullerene-Structured Nanowires of Silicon" Physical Review B, 1999-II, vol. 60, No. 16, pp. 11 593-11 600.

Morales et al., "A Laser Ablation Method for the Synthesis of Crystalline Semiconductor Nanowires" Science, 1998, vol. 279, pp. 208-211.

Peng et al., "Fabrication of Single-Crystalline Silicon Nanowires by Scratching a Silicon Surface with Catalytic Metal Particles" Adv. Funct. Mater., 2006, vol. 16, pp. 387-394.

Rios, "Nanostructured Silicon Wires up Controlled Delivery" Pharmaceutical Technology, 2004, pp. 18-19.

Shi et al., "Synthesis of Large Areas of Highly Oriented Very Long Silicon Nanowires" Advanced Materials, 2000, vol. 12, No. 18, pp. 1343-1345.

Smith et al., "Porous Silicon Formation Mechanisms" J. Appl. Phys. 1992, vol. 71, No. 8, pp. R1-R22.

Suhr et al., "Damping Properties of Epoxy Films with Nanoscale Fillers" Journal of intelligent Material Systems and Structures, 2006, vol. 17, pp. 255-259.

Sunkara et al., "Bulk Synthesis of Silicon Nanowires Using a Low-Temperature Vapor-liquid-solid Method" Applied Physics Letters, 2001, vol. 79, No. 10, pp. 1546-1548.

Wong et al., "Low Temperature Syntheses of Nano-Crystalline Silicon Film and Si Nanorods" Materials Research Society Symp. Proc., 2002, vol. 715, pp. A8.2.1-A8.2.6.

Wu et al., "Growth and Characterization of Well-Aligned nc-Si/$SiO_x$ Composite Nanowires" Advanced Materials, 2002, vol. 14, No. 22, pp. 1643-1646.

Zhu et al., "Preparation and Formation Mechanism of Silicon Nanorods" Journal of Materials Science Letters, 1998, vol. 17, pp. 1897-1898.

"BioSilicon™ Applications" pSivida, http://www,psivida.com/application/other.asp, 2 pages.

Extended European Search date Jun. 14, 2011 issued EP 07 83 9257.

* cited by examiner

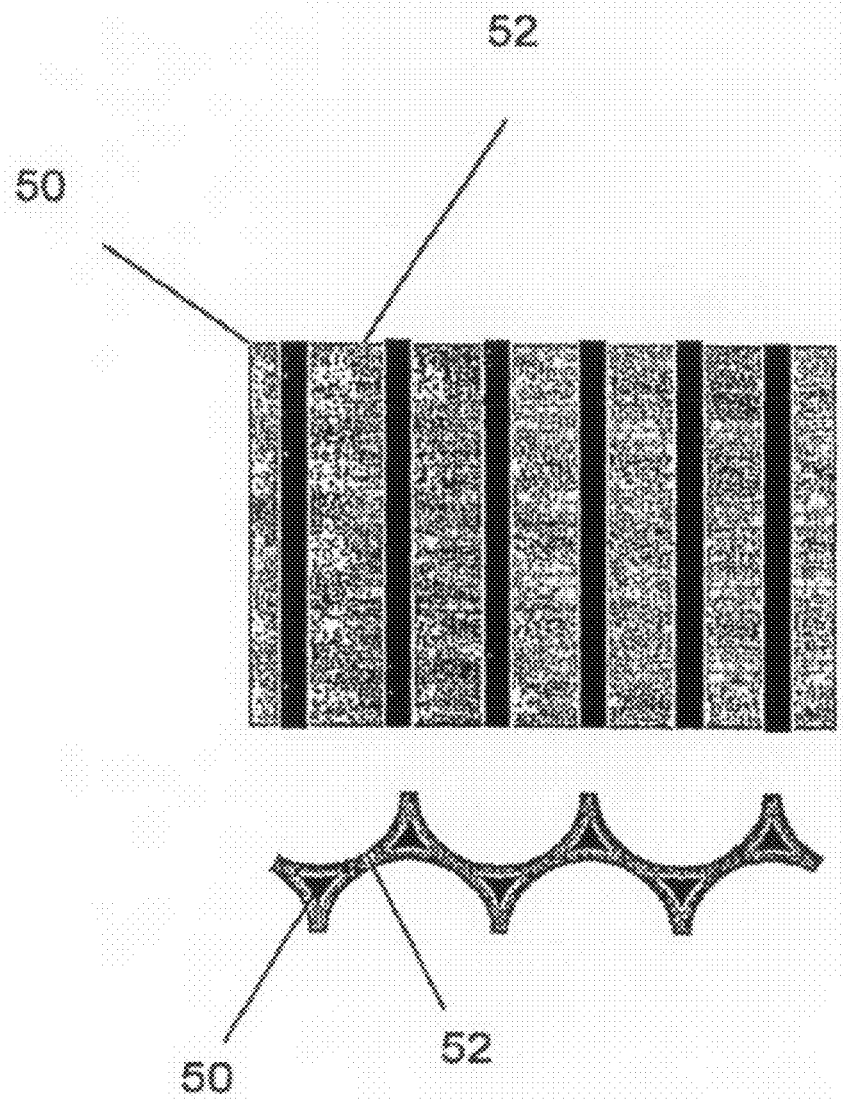

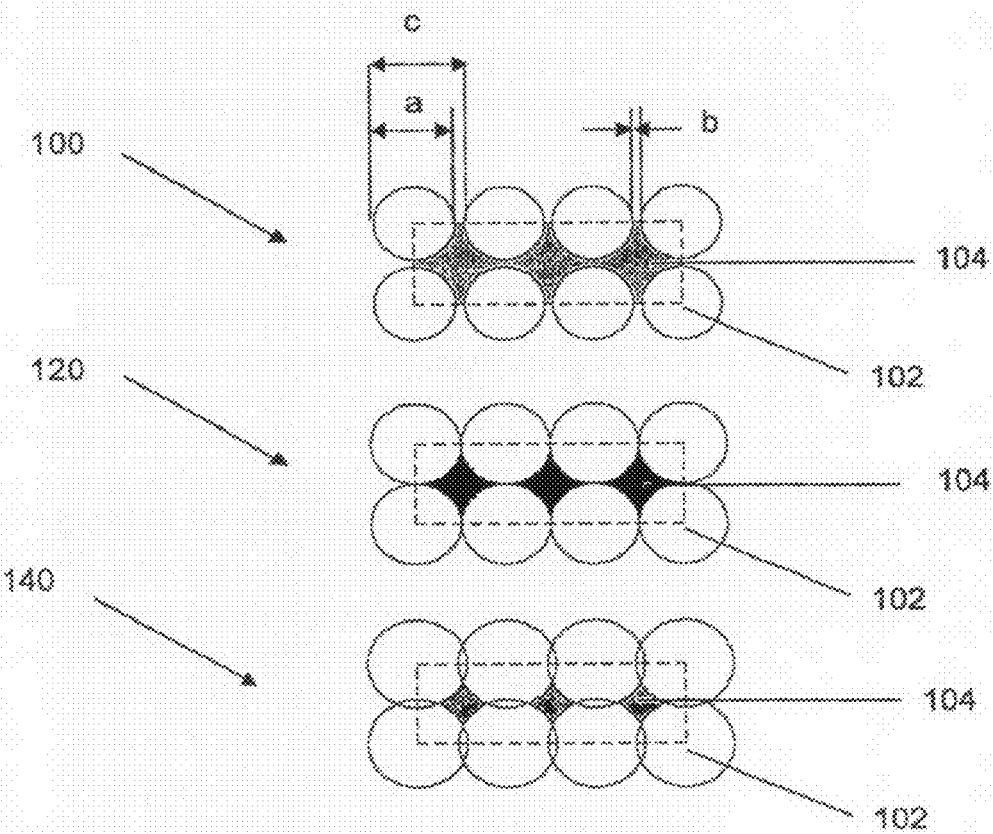

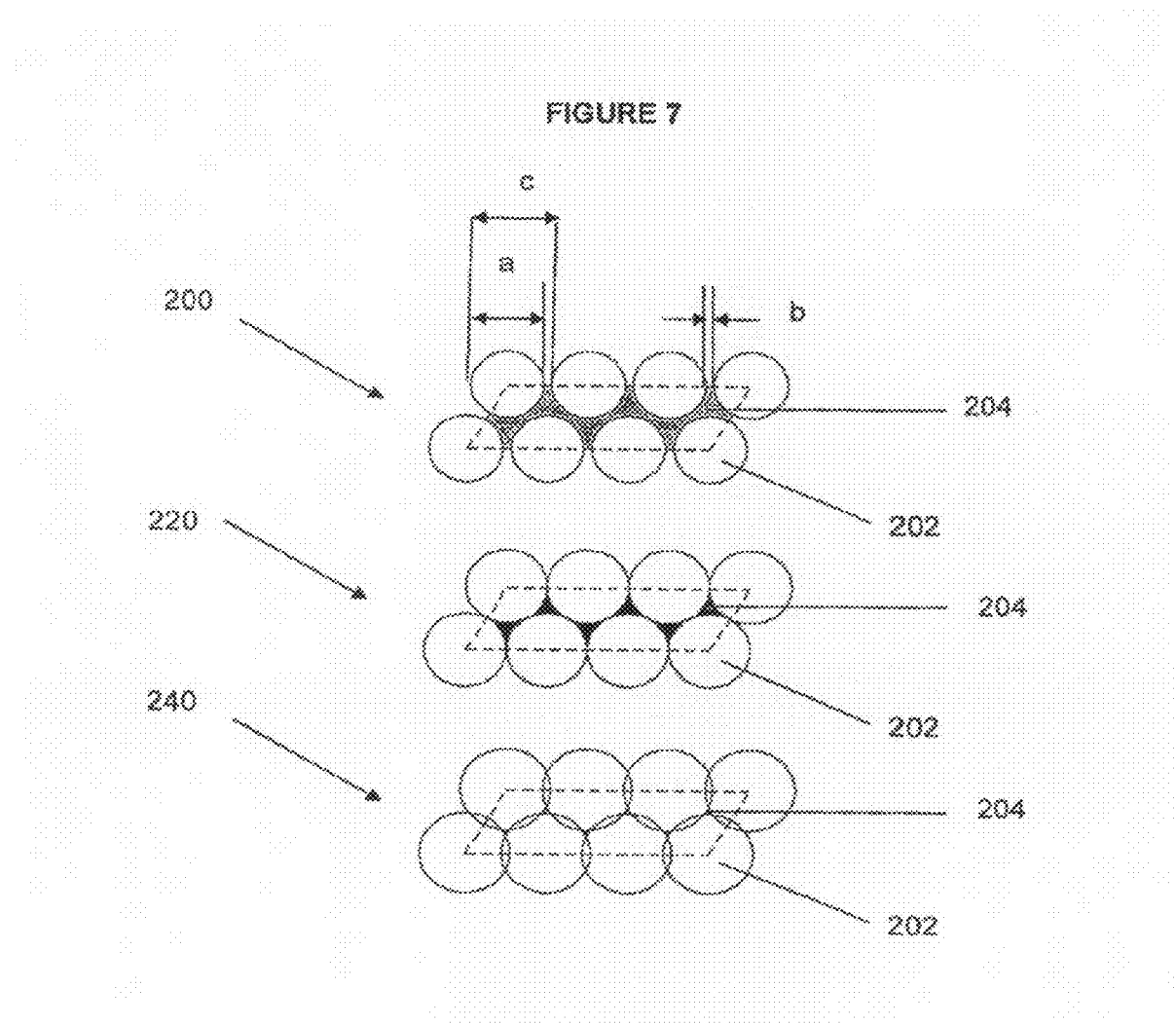

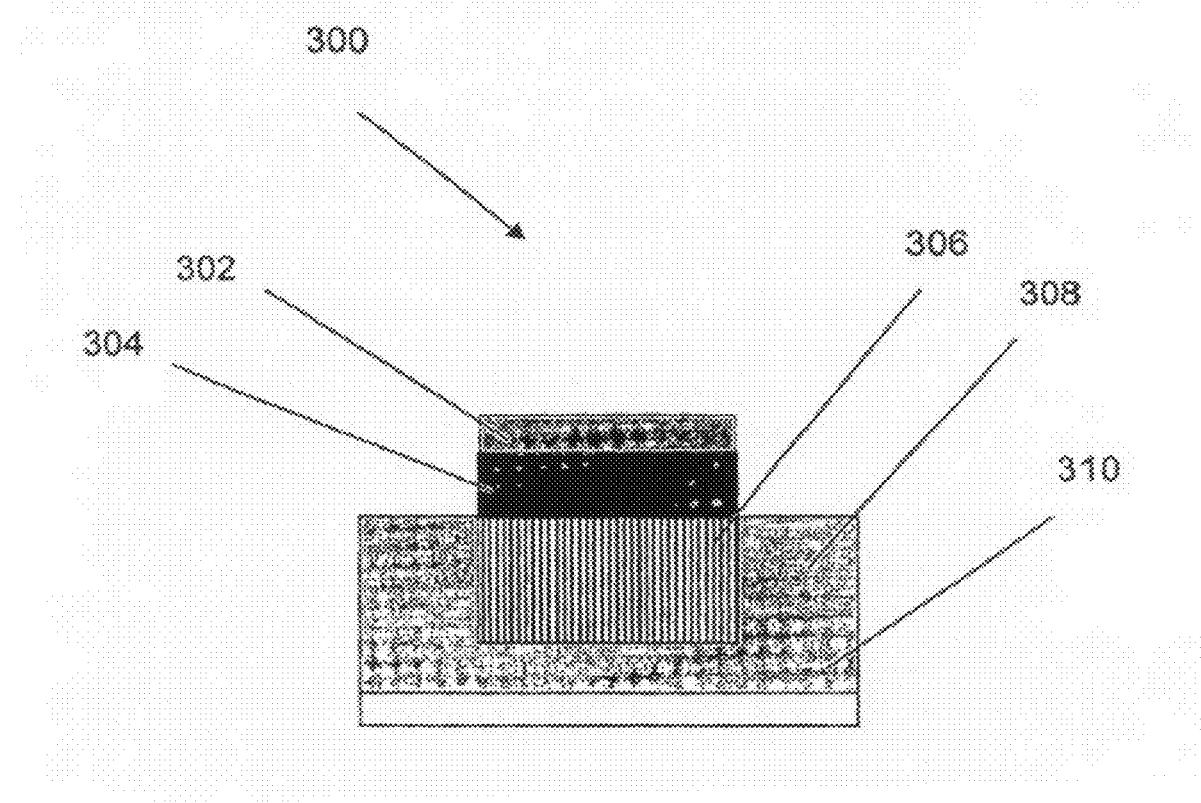

US 8,044,379 B2

WELL-ALIGNED, HIGH ASPECT-RATIO, HIGH-DENSITY SILICON NANOWIRES AND METHODS OF MAKING THE SAME

This application is a National phase filing under 35 U.S.C. §371 of International Application No. PCT/US2007/021348, filed on Oct. 5, 2007, which in turn claims the benefit of U.S. Provisional Application No. 60/849,437 filed Oct. 5, 2006, the entire contents of which are incorporated herein by reference.

FIELD

The present invention relates to structures, materials and compositions formed in whole or in part of silicon nanowires, and methods of forming such structures, materials and compositions.

BACKGROUND

In the discussion that follows, reference is made to certain structures and/or methods. However, the following references should not be construed as an admission that these structures and/or methods constitute prior art. Applicants expressly reserve the right to demonstrate that such structures and/or methods do not qualify as prior art.

Structures having nanometer-scale dimensions can possess unique and useful properties, such as the quantum behaviors observed in some nanostructures.

One such material is silicon nanowires. The nanowires are characterizable as one-dimensional, small-scale, large surface area wire-like materials that exhibit electron transport, photoluminescent and/or quantum effects. Such materials are of interest for certain medical and electronics applications.

A number of techniques have been described for making such structures. These techniques include lithography, plasma etching, plasma deposition, reactive ion etching, chemical vapor deposition, laser ablation, sputtering, thermal evaporation decomposition, electron-beam evaporation, supercritical vapor-liquid solid synthesis, electrochemical dissolution, and metal-induced local oxidation and dissolution.

U.S. Pat. No. 5,348,618 discloses a chemical dissolution procedure reportedly for forming silicon nanowires. The procedure comprises a first anodizing step, followed by a second chemical dissolution step to increase pore size. No visual evidence (e.g., imaging) is included in the patent to demonstrate that well-aligned silicon nanowires along the (001) direction were actually achieved.

U.S. Pat. No. 5,458,735 describes a process for forming a "microporous silicon layer" having luminescent properties. The process described therein involves illuminating the anode side of a silicon wafer during at least part of the time in which the wafer is placed in an acidic solution. The microporous layer comprises a n+ doping region in addition to a p+ doping region, thereby forming a p-n junction. The patent does not discuss formation of silicon nanowires.

U.S. Pat. No. 5,552,328 describes the formation of porous silicon light emitting diode arrays. The only discussion of the morphology of the porous silicon describes "a column-like Si structure." The columns are said to have a diameter on the order of 50-100 nanometers. The porous silicon is produced by a electrochemical dissolution process. The reported etching current is 10 mA/cm$^2$, and the etching solution was HF:H$_2$O=1:3. The process is described as taking place with illumination. Moreover, most embodiments described therein involve complicated silicon structures such as p-n junctions or "poly-Si."

A thesis entitled "Investigation of Pristine and Oxidized Porous Silicon" by Andrea Edit of the University of Oulu, dated 2005 discusses the synthesis and properties of porous silicon. It is noted in the thesis that porous silicon can comprise crystalline silicon nanowires. However, the thesis does not describe the morphology or nature of silicon nanowires, or the mechanism(s) of their formation, in any detail. Moreover, the thesis does not describe free-standing nanowires or techniques for obtaining them from a substrate.

Despite the numerous techniques utilized, a need still exists for a simple and cost-effective fabrication method to form well-aligned, high-aspect ratio silicon nanowires in large quantities with tailorable geometries.

SUMMARY OF THE INVENTION

According to the present invention, there are provided well-aligned, high-aspect ratio, high-density, and nanometer size (e.g., <10 nm) silicon nanowires along the (001) direction (vertical to a <100> silicon substrate). In addition, a silicon network structure along the (100) plane (parallel to the <100> silicon substrate) can be formed in between the silicon nanowires and the silicon substrate. Free-standing silicon nanowire bundles and silicon networks (independent from the substrate) can be obtained by ultrasonication. The results are highly repeatable and the geometries of the products are highly controllable.

A method performed according to the one aspect of the present invention for producing the above described silicon nanowires involves a one-step only electrochemical etching of a heavily doped p-type silicon wafer with a low-concentration (e.g., 5-20%) ethanoic hydrofluoric acid etching solution and a relatively high current density (e.g., 15-30 mA/cm$^2$) to produce an ultrahigh porosity (e.g., >80%) structure, without further chemical dissolution.

One optional embodiment of the present invention provides a method of producing silicon nanowires by electrochemically etching a silicon substrate, the method comprising providing the substrate in the form of a doped silicon material; formulating an etching solution comprising ethanol and hydrofluoric acid, the etching solution comprising 1-38% hydrofluoric acid, by volume; applying a current density of 1-2,000 mA/cm$^2$; and electrochemically etching the substrate for 1 second-24 hours.

According to a further optional aspect, the present invention provides one or more silicon nanowires obtained by the above-described processes.

According to another alternative embodiment, the present invention provides a structure comprising silicon nanowires, the structure comprising well-aligned, densely packed bundles of silicon nanowires, each nanowire having a diameter of less than about 50 nm and a length of 10 nm-100 microns, the dimensions of the nanowires being substantially uniform, the structure consisting essentially of silicon and oxygen, in elemental form or as a compound, and the structure having a porosity of at least 80%.

According to still another optional aspect of the present invention, there is provided one or more free-standing silicon nanowires obtained from the structure described above.

According to an additional alterative embodiment, the present invention provides a structure comprising a plurality of silicon nanowires, each nanowire comprising an outer surface; and one or more interconnecting silicon films;

wherein the outer surfaces of the nanowires and the one or more films are oxidized thereby defining an alternating conductor-insulator structure.

BRIEF DESCRIPTION OF THE DRAWING FIGURES

The following description of preferred embodiments can be read in connection with the accompanying drawings in which like reference numerals designate like elements and in which:

FIG. 5 is a schematic illustration of structure comprising silicon nanowires formed according to one embodiment of the present invention.

FIG. 6 is a schematic illustration of three variations of a pore/silicon nanowire distribution or arrangement formed according to the present invention.

FIG. 7 is a schematic illustration of three additional variations of a pore/silicon nanowire distribution or arrangement formed according to the present invention.

FIG. 9 is a schematic illustration of a photovoltaic device constructed according to the principles of the present invention.

DETAILED DESCRIPTION

Figure 1:
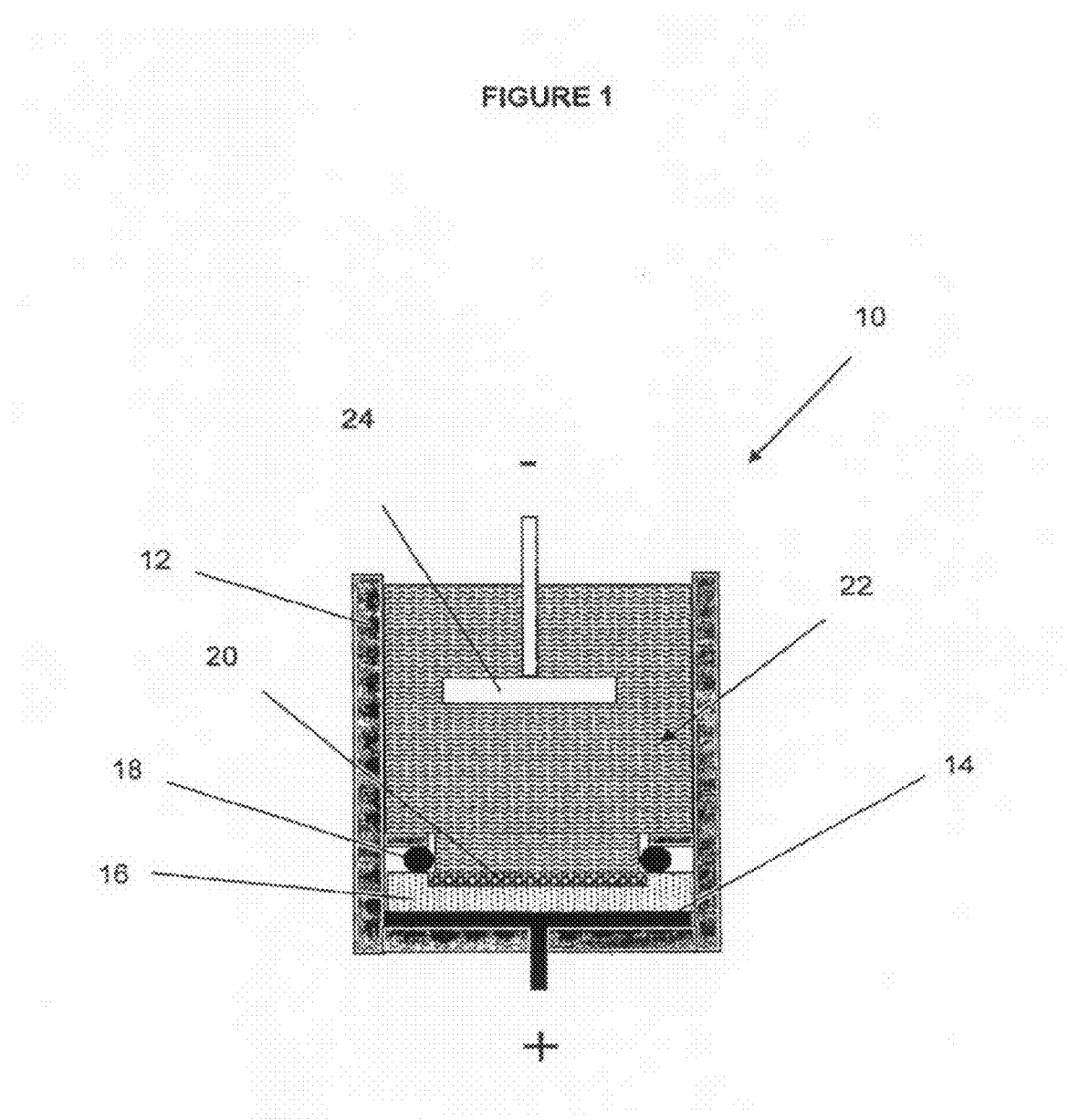
FIG. 1 is a schematic illustration of an exemplary arrangement for carrying out an electrochemical etching procedure according to the present invention.

According to a first aspect of the present invention, there are provided methods for forming well-aligned, high-aspect ratio, high-density, nanometer sized silicon nanowires.

According to the present invention, methods for forming silicon nanowires take into consideration the following factors.

The starting silicon wafer substrate is provided with good crystallinity which ensures the propagation of pores along a certain direction without branching.

Very small and size-uniform pores evenly distributed over the surface of the substrate are formed. The pores propagate homogeneously without substantial or significant branching. An ultrahigh porosity of at least about 80%, 90%, or more is obtained. The pore size can be in the same order as the formed silicon nanowires, i.e., a few nanometers in diameter.

Generally, when low concentration hydrofluoric acid (HF) is used in the etching solution, a relatively lower current density (e.g., 1-15 mA/cm$^2$ for 2 min for 10% HF) shall be used to prevent electropolishing. On the other hand, when a high concentration of HF is used, a relatively higher current density (e.g., 100-2,000 mA/cm$^2$ for 2min. for 38% HF) can be used in order to achieve comparable porosity. A slow etching rate, which can be achieved by using low concentration HF and low current density, can provide time for uniform pore formation and propagation via chemical dissolution. High porosity, which can be achieved by low concentration HF and relatively higher current density (for a certain HF concentration), geometrically ensures the formation of discrete silicon nanowires. On the other hand, highly-porous silicon has a very large surface area to volume ratio, which makes it more active for electropolishing, capillary-induced polishing, and further oxidization.

When a silicon wafer is electrochemically etched, a high HF concentration and low current density result in pore formation, while low HF concentration and high current density (which are preferred, but not mandatory, conditions in this invention) result in electropolishing. For a given set of electrochemical etching conditions, between a "pore formation region" and an "electropolishing region", a "transition region" exists where pore formation and electropolishing compete for control over the surface morphology. See, Smith et al., "Porous Silicon Formation Mechanisms," J. Appl. Phys. 71 (8), 15 Apr. 1992, the entire contents of which are incorporated by reference herein. The resulting structure within this region is generally porous in nature but the pore diameters increase rapidly as the electropolishing potential is approached. Partial electropolishing helps increase the porosity and separate the silicon nanowire bundles into smaller units, which make it easier for further oxidization and lifting up of free-standing silicon nanowires off the surface of the substrate.

The capillary forces caused by drying of solvent from silicon nanowire structures may also play a role in the silicon nanowire formation. When a rinsing solution is dried from the silicon nanostructure surface, the evaporation process imposes a surface tension, which may cause cracking or partial polishing of the silicon nanowire structure. The effects of this capillary-induced polishing are similar to those of electropolishing. Different drying methods and/or agents induce different amounts of surface tension, as follows (shown in decreasing order of surface tension): Water>ethanol>hexane>pentane>critical point drying or freeze drying Thus, one can choose an appropriate drying method in order to intentionally preserve or damage the surface morphology of the silicon nanowire structures.

Consistent with the above considerations, the following exemplary processing conditions for producing silicon nanowire structures are encompassed, but not necessarily required, by the present invention.

According to the present invention a base or substrate material in the form of a doped silicon wafer is utilized. The doped wafer can comprise a boron doped silicon wafer of the p+, p++ type, or n-type and can have a resistivity of less than 1.0000 ohm-cm, less than 0.0100 ohm-cm, or less than 0.0010 ohm-cm. The silicon wafer can also be polished in the <100> directions. The silicon wafer or substrate may be provided with any suitable thickness, for example a thickness on the order of 500-550 microns. The silicon wafer or substrate may also be provided with any suitable planar dimensions, such as a square with 2 centimeter sides. According to a further embodiment, the substrate or silicon wafer lacks a p–n junction.

A substrate material of the type described above is then etched in a suitable etching solution. A suitable etching solution can comprise a mixture of hydrofluoric acid, absolute ethanol, and/or water. HF can be present in the etching solution at concentrations ranging from about 1%-38%, 5%-20%, or 10%, by volume. According to one embodiment, the etching solution can be formulated using: 48% HF+52% H$_2$O solution:ethanol=1:4, by volume as at least a portion thereof.

The substrate is etched with a suitable etching current. A direct current (DC) or alternate current (AC) can be applied the substrate through a suitable contact, such as an aluminum back contact and platinum wire. The etching procedure can be carried out in the dark. Possible etching current values include: 1-2,000 mA/cm$^2$, 100-2,000 mA/cm$^2$, or 1-50 mA/cm$^2$, depending on the HF concentration. According to one embodiment, the current density for etching with a 10% HF solution can be about 1-50 mA/cm$^2$, or 15-30 mA/cm$^2$. According to a further embodiment, the current density for etching with a 38% HF solution can be 100-2,000 mA/cm$^2$.

According one alternative embodiment of the present invention, illumination may be applied during electrochemical etching, with the goal of imparting luminescent properties to the silicon nanowires.

Etching is carried out for a suitable period of time, such as 1 second-24 hours, 1-60 min.; or 1-10 min. For example, when utilizing a solution containing about 10% HF, etching can be carried out for about 1-60 min., or alternatively 1-10 min. According one embodiment, the etching process is carried out in a single step.

The construction of a suitable arrangement or device for carrying out a process as described herein should be within the capabilities of those skilled in the art. For purposes of illustration, one such suitable arrangement is depicted in FIG. 1, wherein the components illustrated therein will be described from bottom to top. The arrangement 10 of the illustrative non-limiting embodiment comprises a tank or cell 12 made from a suitable material such as polytetrafluoroethylene. An anode 14, such as a thin sheet of aluminum, is placed under a substrate or silicon wafer 16. A seal, such as o-ring 18 is placed on top of the substrate or wafer 16, the inner diameter of which defines an etching area 20 via exposure to the etching solution 22. Finally, a cathode 24, such as a platinum wire or mesh is introduced into the tank or cell 12.

After the etching process has been completed, the substrate is removed from the etching solution, washed and/or dried by a suitable technique. For example, after completion of etching, the etched substrate can be washed with pure ethanol. Those etched substrates having high-porosity and/or thick etching depth can be washed with pentane or hexane. Pure ethanol can be used as a transition liquid between water and pentane, which are not miscible. Subsequent to, or concurrently with the above-described washing procedure, an inert gas, such as nitrogen, can be blown over the surface of the etched substrate. Alternatively, the etched substrate can be subjected to a supercritical drying or freeze drying procedure. For purposes of illustration, the substrate can be exposed to liquid carbon dioxide.

Free-standing silicon nanowire structures can optionally be lifted off of the etched substrate by a suitable removal technique. According to one embodiment of the present invention, the etched substrate is subjected to ultrasonication in a solution. This solution can be ethanol, water, or other solvent. The well-aligned silicon nanowire bundles can be lifted off from the substrate as soon as the ultrasonication is applied. With increasing amount of time in ultrasonication (hours to days), the width and the thickness of the silicon nanowire bundle will be decreased. According to specific, non-limiting examples, ultrasonication can be carried out for a period of time ranging from on the order of 5 minutes, 1 hour, 24 hours, 48 hours, or more.

Figure 2:
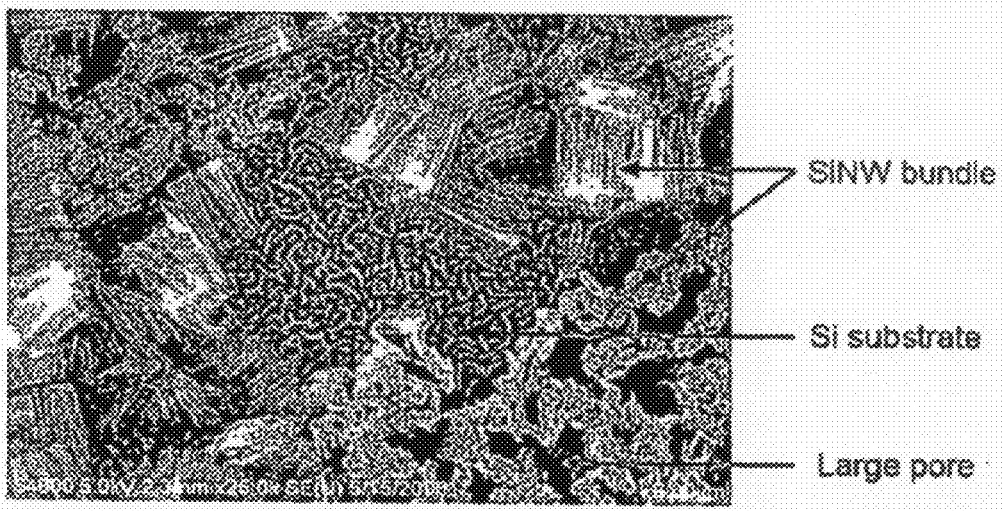
FIG. 2 is an image of the surface of an etched substrate and structural details associated therewith.
Figure 3A:
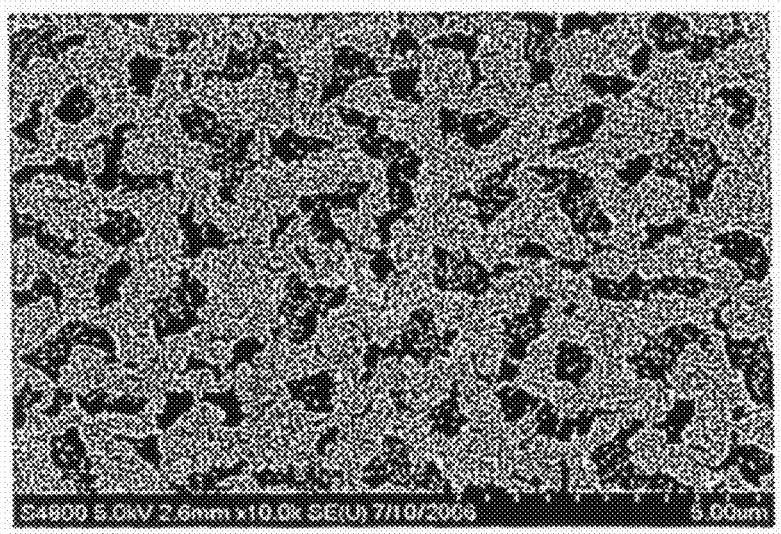
FIGS. 3A-3D illustrate typical morphologies of silicon nanowire structures formed according to the principles of the present invention.
Figure 3B:
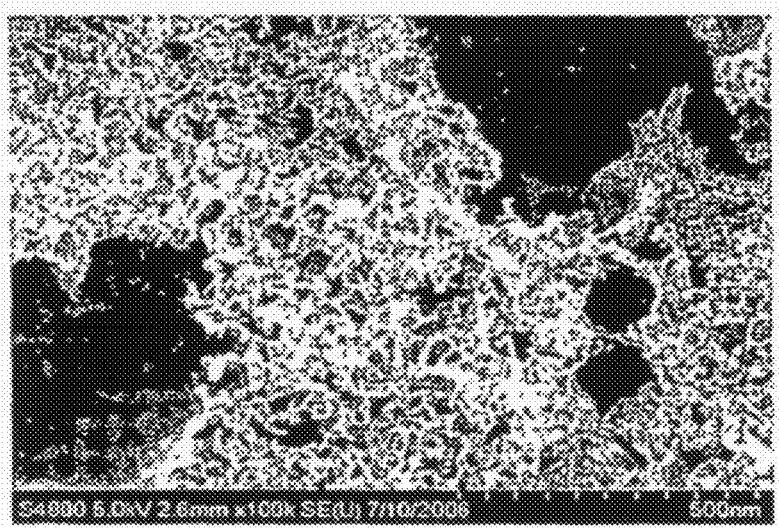
Figure 3C:
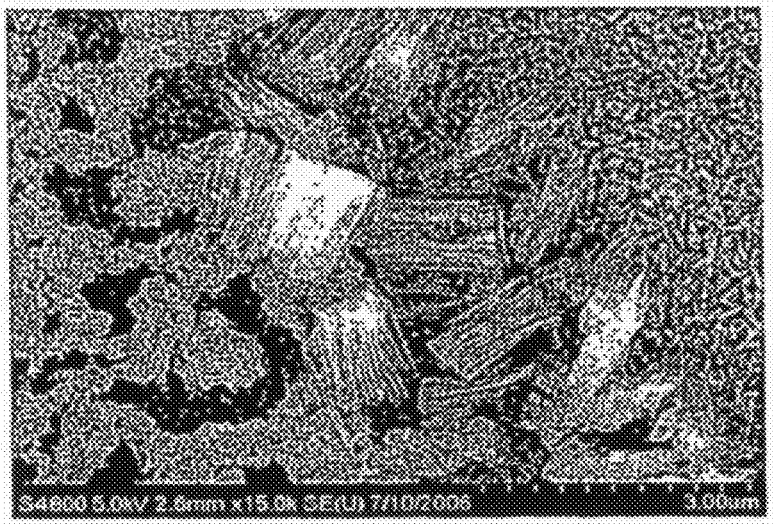
Figure 3D:

When the above described conditions are used; silicon nanowire structures are formed in the skeleton of the silicon crystalline structure on the surface of the etched substrate, as illustrated for example in FIGS. 2-3D. These silicon nanowires are characterizable as being well-aligned, densely packed, in the bundle form, and generally vertical to the silicon substrate (i.e., along (001) direction). Each individual silicon nanowire has a diameter of less than 50 nm, with a majority of them being less than 10 nm, such as 5-8 nm. The length of the silicon nanowires range from 0.5-5.0 microns (e.g. about a 790 nm), the length being linearly proportional to the etching duration for a certain HF concentration. Each silicon nanowire can also be provided with a relatively high aspect ratio (e.g., length divided by diameter). For example, silicon nanowires formed according to the principles of the present invention can have an aspect ratio of 1-10,000, 10-1,000, or 50-500. According to one optional embodiment, the aspect ratio is at least 80. The dimensions of the silicon nanowires are highly uniform within a same sample. The morphology of the silicon nanowires thus obtained is highly repeatable. The sample illustrated therein was etched with 10% HF at 19.5 mA/cm$^2$ for 4 min. and dried with ethanol. The physical color of the sample surface is pale green. The etching depth or the length of the silicon nanowire is 1.5 μm. FIG. 3A is top view showing overall morphology and polished regions with macro pore size of ~1 μm, mag=10 k. FIG. 3B is a top view showing a skeleton of the silicon crystalline structure, with micro pore size of 10-20 nm, mag=100 k. FIG. 3C is a top view, of a surface scratch revealing silicon nanowire bundles and the silicon network underneath, mag=15 k. FIG. 3D is an angled view of the top surface showing silicon nanowires and the silicon network, mag=30 k.

The silicon nanowires formed according to the present invention are typically interconnected by ultra thin films (in a bundle form), the composition of these films is either silicon or silicon oxide. The films may be amorphous, while the nanowires are typically crystalline. The silicon nanowires have very high purity silicon content. Only silicon and oxygen are detected when Energy Dispersive X-ray Spectroscopy (EDS) and Fourier Transform Infrared (FTIR) were used to analyze the composition. The Si/O ratio is highest at the silicon nanowires and lowest at the interconnecting films. Thus, the nanowire/film structure supports a conductor-insulator-conductor type structure (Si—SiO$_x$—Si). The silicon nanowires can be oxidized if exposed in the ambient air. This oxidization may be greatly reduced by storing the freshly etched silicon substrate in a vacuum, or can be accelerated by exposing the etched substrate to a high temperature in an ambient atmosphere.

The geometry of the silicon nanowires is highly tailorable by changing the etching conditions, such as changing the composition of the etching solution, etching current density, etching duration, and degree of wafer doping (resistivity).

The surface of the etched substrate has a porosity of at least 80%, at least 90%, or greater. The porosity is measured by the gravimetric technique, wherein the porosity is calculated according to the following formula:

$$\text{Porosity} = \frac{V_0 - V_1}{V_0} = \frac{m_0 - m_1}{\rho A h} = \frac{1}{\rho A} \frac{m_0 - m_1}{h} \times 100\%$$

Where $V_0-V_1$ is the difference in volume after etching, $m_0-m_1$ is the difference in weight after etching, $\rho$ is density of the bulk silicon, A is etched surface area, and h is the etching depth.

If the porosity is too high (i.e., more than 95%) or the length of the silicon nanowires is too long, the formed silicon nanowires may collapse due to capillary force and no longer be well-aligned and vertical to the substrate. If the porosity is too low or the pore size is too large, individual silicon nanowires are less distinguishable. That is, the nanowires tend to be highly interconnected by thicker films.

In addition to the silicon nanowire bundles mentioned above, there is a thin layer of silicon network formed in between silicon nanowire bundles and the silicon substrate. The silicon network consists of silicon nanowires of 1-50 nm, or 10 nm or less in diameter and hollow holes (some times filled with ultra thin silicon film) of 1 nm-1 micron, or 10-100 nm in diameter (See, e.g., FIGS. 3C and 3D).

Figure 4A:
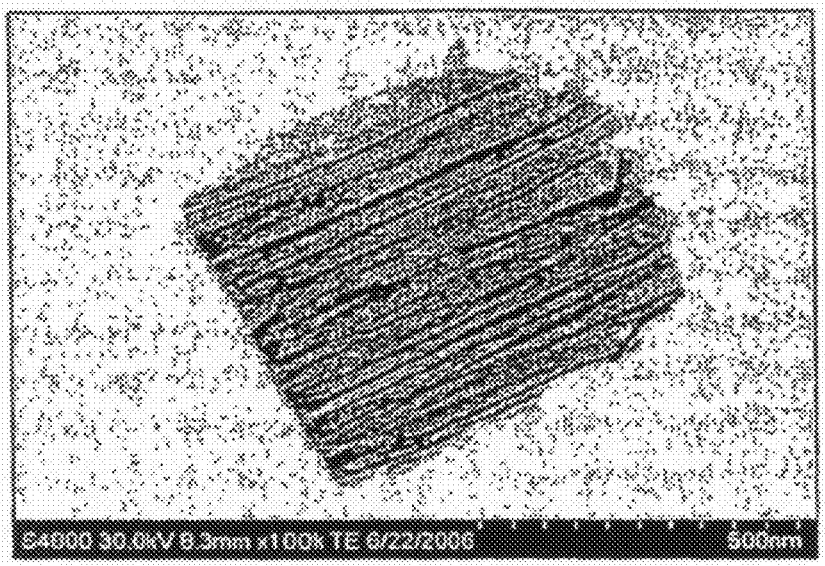
FIGS. 4A-4B illustrate typical morphologies of free-standing silicon nanowire structures formed on an etched substrate, according to the principles of the present invention.
Figure 4B:
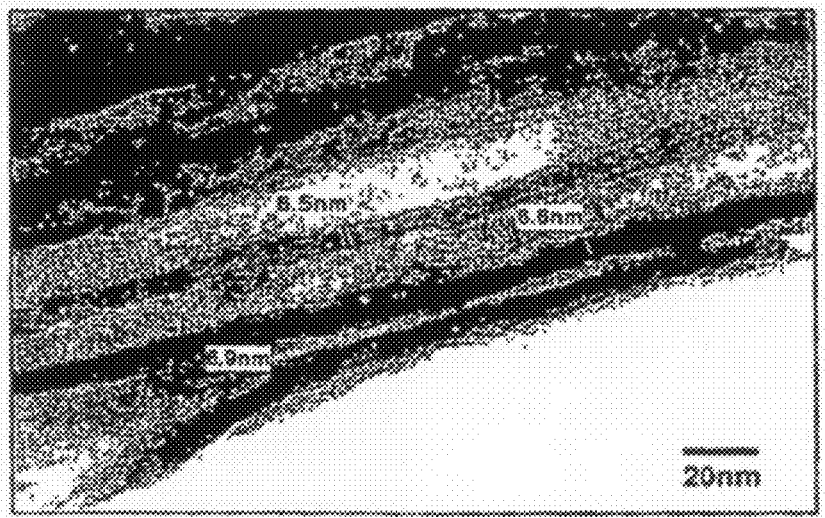

When the silicon nanowires are optionally removed from the etched substrate by a suitable removal procedure, as discussed above, these free-standing silicon nanowires can be imaged with STEM or TEM by applying a droplet of the colloid solution on to a TEM·grid and then evaporate the solvent, as is shown in FIGS. 4A and 4B. It is found that each individual silicon nanowire has on average a diameter of less than 10 nm and retains its original length (without breaking), i.e., 10 nm-100 μm. The free standing silicon nanowires are well-aligned and interconnected by ultra thin films. The thickness of the bundle is a lot smaller than its width. Thus the silicon nanowire bundle is close to a 2-dimensional structure. FIG. 4A is an image of a silicon nanowire bundle, mag.=100 k. The sample illustrated in FIG. 4A was etched with 10% HF at 17.7 mA/cm$^2$ for 2 min., and then ultrasonicated in ethanol for 21 hr. FIG. 4B is an image showing details of silicon wires and interconnecting films, mag.=150 k. The sample illustrated in FIG. 4B was etched with 10% HF at 20.4 mA/cm$^2$ for 2 min. and then ultrasonicated in ethanol for 5 min. EDS and FTIR characterization show only silicon and oxygen are present in the structure.

Due to the large surface area, the freestanding silicon nanowire structure can be oxidized when exposed to air. The outer sheath of the silicon nanowire and the interconnecting thin film will be oxidized first. By this means, a 2-dimensional or 3-dimensional, free-standing or substrated, alternating conductor-insulator-conductor structure can be obtained, as schematically illustrated in FIG. 5. As illustrated therein, the structure comprises nanowires or nanowire bundles 50 formed mainly from silicon, separated by interconnecting areas 52 formed of silicon oxide. Such structures may be useful in a number of different applications, such as a transistor array. A freshly etched silicon sample can also be oxidized intentionally by placing the etched substrate in an oven (prior to ultrasonication). Single strands of silicon nanowire may also be obtained by ultrasonication of a freshly etched or oxidized silicon sample in a pH solution (weak acid or base), in order to dissolve the interconnecting thin film.

FIG. 6 schematically illustrates three different pore distributions (100, 120, 140) within an etched substrate for the formation of silicon nanowires according to the principles of the present invention. As illustrated therein, the pores 102 are separated by the remaining silicon material in the form of nanowires 104. Is further illustrated therein, the pores 102 have a diameter a, and may have intervening silicon nanowire material of a dimension b. The spacing between pores 102 is represented by dimension c, which corresponds to a+b. According to the principles of the present invention, the ratio of the diameter a of the pores 102 to the spacing c between pores 102 is approximately 0.9-1.1 (a/c=0.9-1.1). According to certain embodiments, this ratio is approximately 1.0. The a/c ratio of arrangements 100, 120 and 140 are 0.9, 1.0 and 1.1, respectively.

FIG. 7 schematically illustrates three additional pore distributions (200, 220, 240) within an etched substrate for the formation of silicon nanowires according to the principles of the present invention. The main distinction between the distributions illustrated in FIG. 7, and the previously described distributions illustrated in FIG. 6, is that the pores are distributed along the outline of a parallelogram in the pore distributions illustrated in FIG. 7, which results in a triangular distribution of the remaining silicon nanowire material. These distributions (200, 202, 204) generally result in a higher overall porosity. As illustrated in FIG. 7, the pores 202 or separated by the remaining silicon material in the form of nanowires 204. Is further illustrated therein, the pores 202 have a diameter a, and may have intervening silicon nanowire material of a dimension b. The spacing between pores 202 is represented by dimension c, which corresponds to a+b. According to the principles of the present invention, the ratio of the diameter a of the pores 202 to the spacing c between pores 202 is approximately 0.9-1.1 (a/c=0.9-1.1). According to certain embodiments, this ratio is approximately 1.0. The a/c ratio of arrangements 200, 220 and 240 are 0.9, 1.0 and 1.1, respectively.

Figure 8:
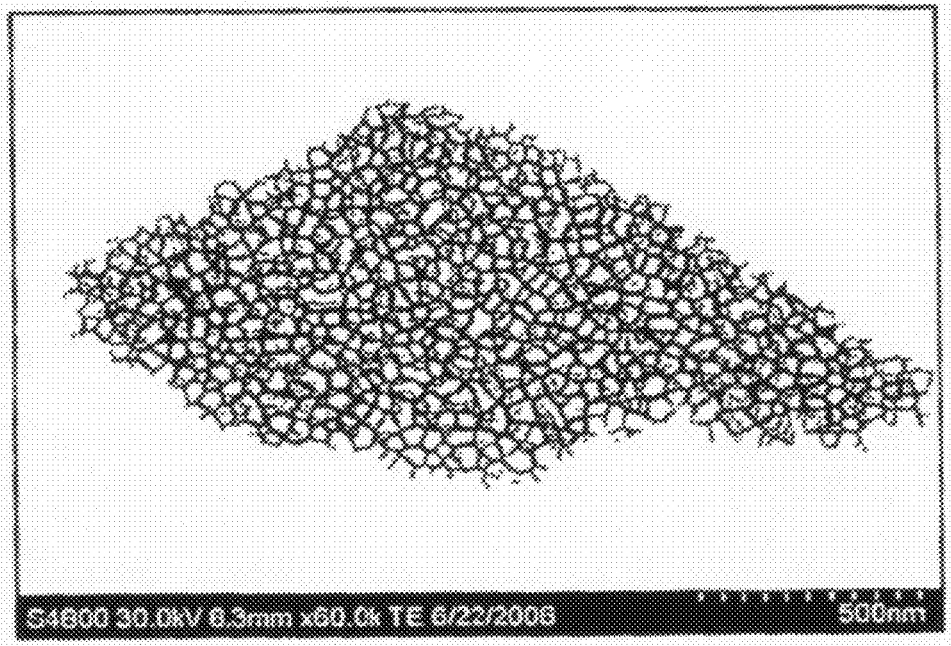
FIG. 8 is an image of a fragment of a silicon network layer.

As is shown in FIG. 8, another structure that can be obtained is a web-like silicon network. This network was originally located underneath the silicon nanowire bundles and above the silicon substrate. This layer can also lifted off by ultrasonication and broken into smaller pieces, i.e., submicron to microns, depending on the duration of the ultrasonication. The silicon network includes silicon nanowires of on average less than 10 nm in diameter and hollow holes or pores (occasionally filled with ultra thin silicon film) of around 50 nm in diameter. The sample illustrated in FIG. 8 was etched with 10% HF at 17.7 mA/cm$^2$ for 2 minutes, and then ultrasonicated in ethanol for 21 hr. FIG. 8 illustrates a silicon network with an average pore size of about 50 nm, mag.=60 k.

The etched substrates and free standing nanowires of the present invention may be utilized in a number or different applications, including but not limited to: components to form silicon based optoelectronics, quantum devices, transistors, flat-panel displays (e.g., TFT displays), chemical and/or biological sensors, biomaterials, coatings, composites, orthopedics, wound healing components, tissue engineering materials, drug delivery devices, etc.

One example of the device incorporating the silicon nanowire structures of the present invention is illustrated in FIG. 9. More specifically, as illustrated therein, a photovoltaic device 300 may be provided which incorporates the silicon nanowire structures of the present invention. The device 300 includes a conductive electrode layer 302 formed of any suitable conductive material or combination of materials, such as one or more metals, a conductive polymer layer 304 formed from any suitable conductive polymer, such as P3HT (poly-3-hexylthiophene), a plurality of silicon nanowires 306 formed as described above in accordance with present invention forming a plurality of heterojunctions with the conductive polymer 304, a silicon substrate or wafer 308, followed by a counter electrode layer 310 formed from any suitable conductive material or combination of materials, such as one or more metals. The device 300, which includes the silicon nanowires 306, advantageously provides a very large surface area to volume ratio at the interface with the conductive polymer 304. These heterojunctions between the silicon nanowires 306 and a conductive polymer 304 provides a mechanism for improved transfer of energy therebetween, which in turn improves the efficiency of the photovoltaic device 300.

Numbers expressing quantities of ingredients, constituents, reaction conditions, and so forth used in this specification are to be understood as being modified in all instances by the term "about". Notwithstanding that the numerical ranges and parameters setting forth, the broad scope of the subject matter presented herein are approximations, the numerical values set forth are indicated as precisely as possible. Any numerical value, however, may inherently contain certain errors necessarily resulting from the their respective measurement techniques and evidenced by the standard deviation associated therewith.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

I claim:

1. A structure comprising:
well-aligned, densely packed bundles of silicon nanowires, each nanowire having a diameter of less than about 50 nm and a length of 10 nm -100 microns, the dimensions of the nanowires being substantially uniform, the structure consisting essentially of silicon and oxygen, or compounds thereof, and the structure having a porosity of at least 80%.

2. A method of producing the structure of claim 1 by electrochemically etching a silicon substrate, the method comprising:
providing the substrate in the form of a doped silicon material;
formulating an etching solution comprising ethanol and hydrofluoric acid, the etching solution comprising 1-38% hydrofluoric acid, by volume;
applying a current density of 1-2,000 $mA/cm^2$; and
electrochemically etching the substrate for 1 second-24 hours.

3. The method of claim 2, wherein the substrate is doped with boron.

4. The method of claim 2, wherein the substrate is of the p-type, p+ type, p++ - type, or n-type.

5. The method of claim 2, wherein the substrate has a resistivity of 1.0000, 0.0100, 0.0010 ohm-cm, or less than any of these values.

6. The method of claim 2, wherein the substrate is polished in the <100>directions.

7. The method of claim 2, wherein the substrate has a thickness of about 500-550 microns.

8. The method of claim 2, wherein the substrate lacks a p-n junction.

9. The method of claim 2, wherein the substrate is electrochemically etched in a single step.

10. The method of claim 2, wherein the etching solution comprises 5-20% hydrofluoric acid, by volume.

11. The method of claim 2, wherein the etching solution further comprises water.

12. The method of claim 2, wherein the etching solution comprises hydrofluoric acid, water and ethanol in the following proportions:
48%HF+52% $H_2O$ solution: ethanol=1:4 by volume.

13. The method of claim 2, comprising applying a current density and providing an etching solution formulation according to one of the following alternatives:
(a) 100-2,000 $mA/cm^2$ and 38%HF;
(b) 1-50 $mA/cm^2$ and 10%HF; or
(c) 15-30 $mA/cm^2$ and 10%HF.

14. The method of claim 2, wherein the current is direct current or alternating current.

15. The method of claim 2, wherein the electrochemical etching is carried out in the dark or in the presence of a light source.

16. The method of claim 2, comprising electrochemically etching the substrate for 1 second -24 hours, 1-60 minutes, or 1-10 minutes.

17. The method of claim 2, further comprising removing the substrate from the etching solution and washing and/or drying the substrate.

18. The method of claim 2, comprising washing the substrate after removal from the etching solution with one or more of: water, ethanol, hexane, or pentane.

19. The method of claim 2, comprising drying the substrate by blowing an inert gas over the surface thereof.

20. The method of claim 2, comprising subjecting the substrate to a supercritical drying or freeze drying procedure.

21. The method of claim 2, further comprising removing the silicon nanowires from the surface of the substrate.

22. The method of claim 21, comprising immersing the substrate in an ultrasonication solution and applying ultrasonic energy thereto.

23. The method of claim 22, wherein the ultrasonic energy is applied for 5 minutes -48 hours, or more.

24. The method of claim 2, wherein the substrate is at least partially polished such as by electropolishing and/or evaporation induced polishing.

25. The method of claim 2, further comprising at least partially oxidizing the etched substrate.

26. The method of claim 2, comprising electrochemically etching the substrate to produce a porosity of at least 80%, or at least 90%, on the etched surface thereof.

27. One or more silicon nanowire obtained by the process of claim 2.

28. The structure of claim 1, comprising a silicon substrate, and the nanowires being substantially vertically aligned on a surface of the substrate in the (001) direction.

29. The structure of claim 1, wherein at least a majority of the silicon nanowires have a diameter of about 10 nm or less.

30. The structure of claim 1, wherein each nanowire has an aspect ratio of 1-10,000, 10-1,000 or 50-500.

31. The structure of claim 1, comprising a porosity of at least 90%.

32. The structure of claim 1, further comprising one or more thin films of silicon or silicon oxide interconnecting the silicon nanowires thereby forming an interconnected network.

33. The structure of claim 32, wherein the interconnected network comprises nanowires having a diameter of about 10 nm or less, and pores having a diameter of about 1 nm -1 micron, or 10-100 nm.

34. The structure of claim 1, wherein the structure is at least partially polished, such as by electropolishing and/or evaporation induced polishing.

35. The structure of claim 1, comprising pores that are substantially lack branching.

36. The structure of claim 1, comprising a substrate, the substrate comprising a boron-doped silicon wafer.

37. The structure of claim 36, wherein the substrate comprises a p type, p+ type or p++ type doped silicon.

38. The structure of claim 37, wherein the substrate has a resistivity of 1.0000, 0.0100, 0.0010 ohm-cm, or less than any of these values.

39. The structure of claim 1, wherein the structure possesses luminescent properties.

40. The structure of claim 1, wherein each nanowire comprise an outer surface; and one or more interconnecting silicon films;
wherein the outer surfaces of the nanowires and the one or more films are oxidized thereby defining an alternating conductor-insulator structure.

41. One or more free-standing silicon nanowires obtained from the structure defined by claim 1.

42. The structure of claim 1, comprising a plurality of pores separating the silicon nanowires, the pores having a diameter, and the pores being separated by a separation distance, wherein the ratio of the pore diameter to the separation distance is 0.9-1.1.

43. A photovoltaic device comprising:
a structure as set forth in claim 1; and
a conductive polymer;
wherein a plurality of heterojunctions are formed between the silicon nanowires of the structure and the conductive polymer.

44. The device of claim 43, further comprising:
a conductive electrode layer,
a layer comprising the conductive polymer;
a silicon substrate comprising the structure; and
a conductive counter electrode layer.

45. A structure comprising:
a plurality of silicon nanowires, each nanowire comprising an outer surface; and
one or more interconnecting silicon films;
wherein the outer surfaces of the nanowires and the one or more films are oxidized thereby defining an alternating conductor-insulator structure.

\* \* \* \* \*